United States Patent [19]

Ravoalavoson et al.

[11] Patent Number: 5,105,446
[45] Date of Patent: Apr. 14, 1992

[54] DIGITAL METHOD OF CORRECTING NON-LINEARITY IN A TRANSMISSION CHAIN, AND APPARATUS IMPLEMENTING THE METHOD

[75] Inventors: Robert Ravoalavoson, Courbevoie; Guy Allemand, Levallois-Perret, both of France

[73] Assignee: Alcatel Transmission par Faisceaux Hertziens, France

[21] Appl. No.: 593,159

[22] Filed: Oct. 5, 1990

[30] Foreign Application Priority Data

Oct. 18, 1989 [FR] France ............................ 89 13604

[51] Int. Cl.$^5$ ............................................. H04L 25/49
[52] U.S. Cl. ............................ 375/60; 332/160; 330/149
[58] Field of Search ................. 375/60; 332/159, 160; 330/149; 455/116, 126

[56] References Cited

U.S. PATENT DOCUMENTS

| | | | |
|---|---|---|---|
| 4,291,277 | 9/1981 | Davis et al. | 375/60 |
| 4,462,001 | 7/1984 | Girard | 330/149 |
| 4,554,514 | 11/1985 | Whartenby et al. | 332/160 |
| 4,700,151 | 10/1987 | Nagata | 455/126 |
| 4,801,899 | 1/1989 | Ashida | 375/60 |
| 4,890,301 | 12/1989 | Hedberg | 375/60 |
| 4,908,840 | 3/1990 | Kakimoto | 375/60 |
| 4,930,141 | 5/1990 | Ohmagari | 375/60 |

OTHER PUBLICATIONS

ICC '80—International Conference on Communications, Seattle, US, Jun. 8-12, 1980, vol. 2, IEEE, New York, USA, pp. 158-162; R. P. Hecken et al.: "Predistortion linearization of the AR 6A Transmitter".

GLOBECOM '85—IEEE Global Telecommunications Conference, New Orleans, USA, Dec. 2-5, 1985, vol. 3, IEEE, New York, USA, pp. 1466-1470; T. Nojima et al.: "The Design of a Predistortion Linearization Circuit for high-Level Modulation Radio Systems".

*Primary Examiner*—Benedict V. Safourek
*Assistant Examiner*—Young Tse
*Attorney, Agent, or Firm*—Sughrue, Mion, Zinn, Macpeak & Seas

[57] ABSTRACT

The invention provide a digital method of correcting non-linearity in a transmission chain, in which the effects of amplifier non-linearities are compensated by applying predistortion in baseband prior to modulation, with the signal being processed digitally in real time. The invention also provides apparatus for implementing the method. The invention is particularly applicable to radio beams for conveying digital signals.

2 Claims, 4 Drawing Sheets

DIGITAL METHOD OF CORRECTING NON-LINEARITY IN A TRANSMISSION CHAIN, AND APPARATUS IMPLEMENTING THE METHOD

The invention relates to a digital method of correcting non-linearity in a transmission chain, and to apparatus for implementing the method.

The method serves to compensate the effects of non-linearities, as may be due, for example, to power amplifiers in a transmission chain. It is particularly applicable to quadrature amplitude modulation (QAM type modulation, e.g. 16, 64, or 256 QAM).

BACKGROUND OF THE INVENTION

The field of application of the invention is that of large capacity point-to-point digital radio transmission. This type of transmission uses travelling wave tube amplifiers or solid state amplifiers (e.g. an ASGA field effect transistor (FET)).

The modulation used for this type of transmission (16 QAM, 64 QAM) requires the transmission chain to have excellent linearity, and conventionally this is obtained by considerably overspecifying the amplifier.

For example, a solid state amplifier may be:
run at 6 dB to 7 dB below full power for 16 QAM; or
run at 8 dB to 10 dB below full power for 64 QAM.
Consequently power amplifier efficiency is particularly bad. For example:
with 16 QAM: power consumed = 40 W, output power = 5 W
with 64 QAM: power consumed = 90 W, output power = 10 W.

The object of the invention is to mitigate these various drawbacks.

SUMMARY OF THE INVENTION

To this end, the present invention provides a digital method of correcting non-linearity in a transmission chain, wherein the effects of amplifier non-linearities are compensated by means of predistortion in baseband prior to modulation, and the digital processing of the signal takes place in real time.

More particularly, the present invention provides a digital method of correcting non-linearity in a transmission chain, in which the effects of amplifier non-linearities are compensated by means of baseband predistortion prior to modulation, the digital processing of the signal taking place in real time, wherein the digital processing is applied to Cartesian coordinates defining two new axes attached to the vector to be corrected, the first new axis being collinear therewith, and the second being in quadrature therewith.

BRIEF DESCRIPTION OF THE DRAWINGS

An implementation of the invention is described by way of example with reference to the accompanying drawings, in which.

DETAILED DESCRIPTION

Figure 1:
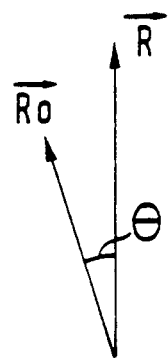
FIGS. 1 and 2 illustrate the field of the invention.
Figure 2:
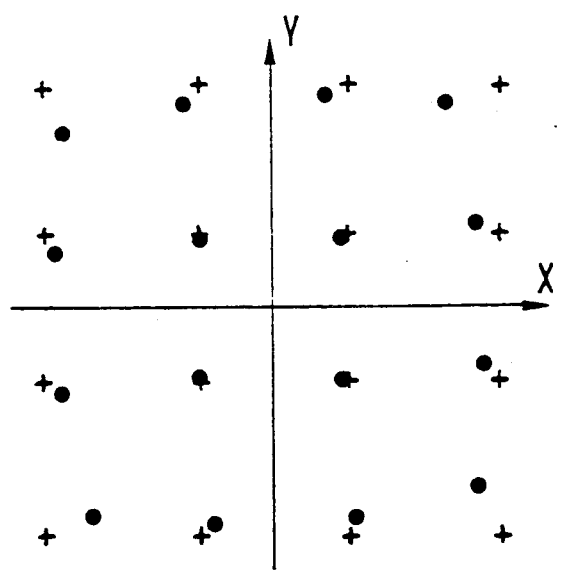

FIGS. 1 and 2 show the utility of a predistortion system on transmission.

FIG. 1 is a Fresnel diagram of a transmitted signal at a given instant in the presence of distortion, thus showing:
a vector R which is the intended vector; and
a vector Ro which is the vector that is actually transmitted.

The initial phase and amplitude of the intended vector are distorted.

FIG. 2 is a constellation diagram showing an example of distorted 16 QAM, with:
"+" = desired points; and
"." = points as actually transmitted.

The problem of correcting amplifier saturation on transmission is well known and constitutes the subject matter of several applications in both the digital field and the analog field.

Figure 3:
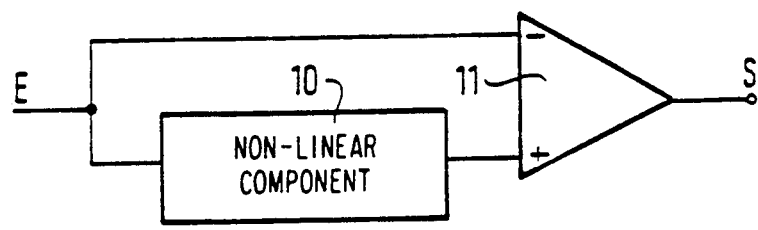
FIGS. 3 to 5 show various prior art embodiments.

An analog corrector is based on an expander designed around a non-linear component 10. The general principle is summarized by the block diagram of FIG. 3 which shows, between an input E and an output S: an amplifier 11 which receives the input signal E on one input and the same signal E on another input after it has passed through a non-linear component 10. The correction provided by such a component 10 is practically scalar.

However, some multipath systems are capable of providing both amplitude and phase predistortion of the signal prior to amplification, either at an intermediate frequency (IF), or at microwave frequency.

Figure 4:
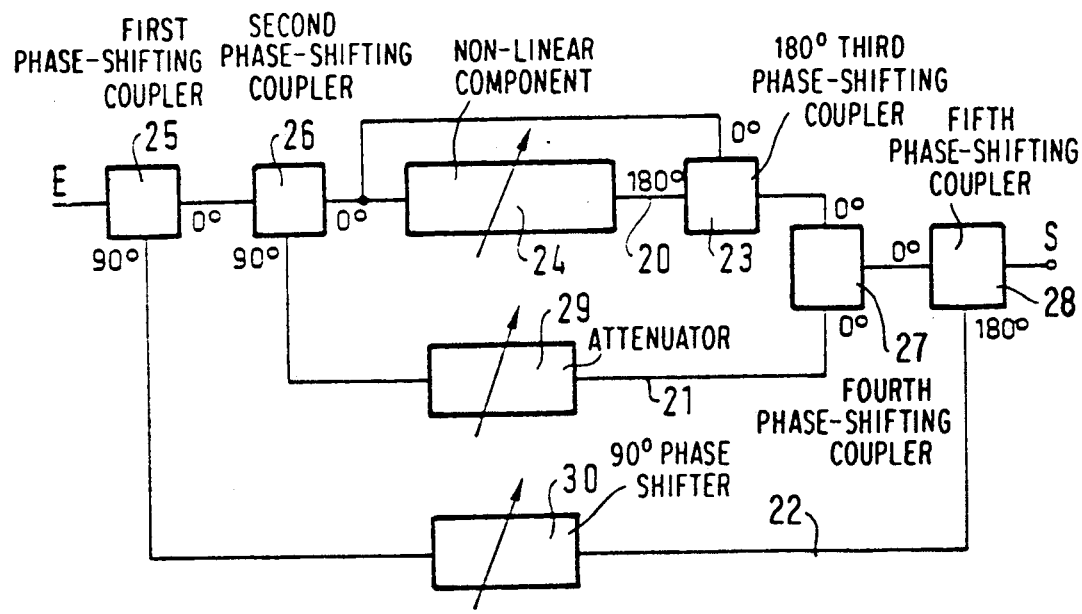

FIG. 4 is a block diagram common to such systems. This diagram has three paths 20, 21, and 22, with the first path 20 including a 180° third phase-shifting coupler 23 whose two inputs are interconnected via a non-linear component 24 connected to both inputs, both inputs thus receiving the input signal E after it has passed respective 0° phase shift paths through first and second phase-shifting couplers 25 and 26, and its output being connected to the output S via a 0° phase-shift path through fourth and fifth phase-shifting couplers 27 and 28. The second path 21 includes an attenuator 29 disposed between a 90° outlet of the second phase shifting coupler 26 and a 0° inlet to the fourth coupler 27. The third path 22 includes a 90° phase shifter 30 disposed between a 90° outlet of the first phase shifting coupler 25 and a 180° inlet of the fifth phase shifting coupler 28.

The first path 20 creates a predistorted vector which, when summed with the second path 21, provides modulus correction.

Summing with the third path 22 of adjustable phase shift serves to optimize phase predistortion.

At IF, the drawbacks are as follows:
passband limitation due to the ratio of correcting passband over operating frequency, particularly in the input phase shifting coupler; and
interdependence between the phase and modulus parameters means that effective phase correction is not possible.

At microwave frequency, the passbands of the various couplers are not a problem, however specific drawbacks are the following:
high component costs; and
numerous adjustments are required which are difficult to make converge, thereby making servo-control impossible.

Digital correction may also be envisaged. Predistortion systems using this principle operate in baseband.

Figure 5:
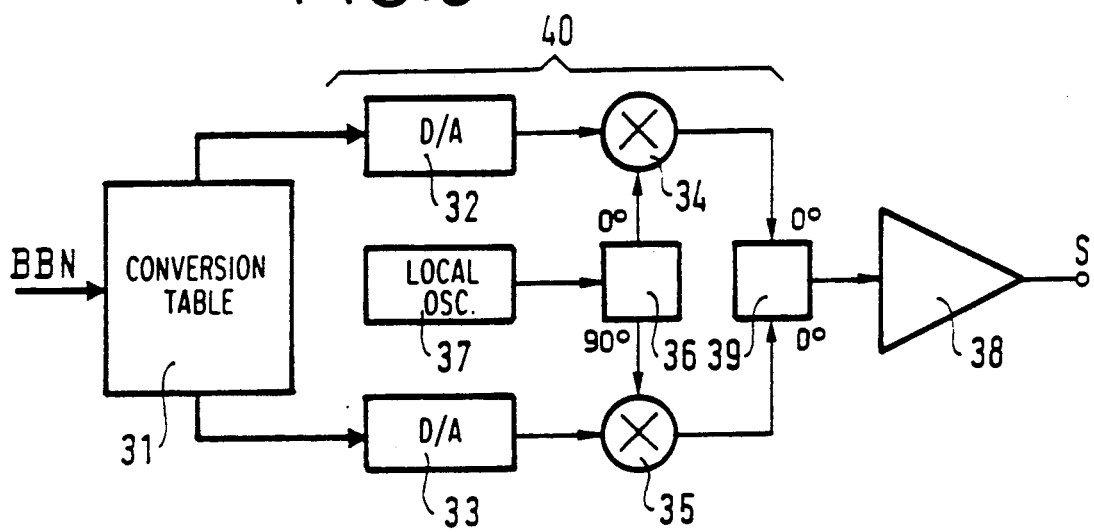

FIG. 5 is a block diagram summarizing existing systems. Digital baseband BBN is processed by a conversion table 31 which applies result samples to two digital-to-analog converters 32 and 33. The outputs from these two converters 32 and 33 are respectively connected to two mixers 34 and 35 which are themselves connected to two outputs of a 0° and 90° coupler 36 which receives a signal from a local oscillator 37. The outputs from the two mixers 34 and 35 are connected to an amplifier 38 that produces distortion via a 0° coupler 39. The portion referenced 40 corresponds to signal modulation.

The principle of digital correction using a table is described in an article entitled "Matrix analysis of mildly non-linear multiple-input, multiple-output systems with memory" by A. M. Saleh, published in the "Bell System Technical Journal", Apr. 28, 1982: with this principle being based on a table of values loaded into read/write memory (RAM) and addressed by the data.

As in preceding systems, systems represented by the block diagram of FIG. 5 require two paths to modulate two quadrature phases of a single oscillator.

Depending on the system implemented, the conversion table takes account either of amplitude only, or of phase only, or else of both amplitude and phase. The system is fully defined by its conversion table and it is thus capable of fully compensating the saturation curve of an amplifier both in amplitude and in phase.

However it has the following drawbacks:
the principle of using a conversion table which makes the system specific to given saturation; and
the table defines a function which is fixed. Phenomena of thermal drift and aging in the components are not followed in any way, except possibly by switching to a different table: this doubles the volume of memory required and servo-control is very difficult and very slow since the entire contents of the table must be modified.

Further, there is no quick remedy to a loss of memory contents due to a power supply glich, and this reduces system availability.

Finally, in addition to being slow, the matrix calculation that must be performed also consumes memory space.

In contrast, the method of the invention performs real time digital processing on the signal. This thus eliminates the concept of a conversion table. The digital processing is performed on the baseband signal prior to modulation.

The input signal is sampled in compliance with Shannon's theorem whereby, when digitizing a signal, it is necessary for the sampling frequency to be not less than twice the maximum frequency contained in the signal passband and that digital filtering may be performed (in which case each sample is defined on a large number of bits).

The general form of saturation functions is known. For an amplitude $Ri$ at the input of a non-linear system, the output at an arbitrary instant is of the form:

$$Ro = a_0 + a_1 Ri + a_2 Ri^2 + a_3 Ri^3 \ldots + a_n Ri^n.$$

The same applies to the phase shift of the output relative to the input:

$$\theta = b_0 + b_1 Ri + b_2 Ri^2 + b_3 Ri^3 \ldots + b_n Ri^n.$$

It is thus possible to apply amplitude and phase correction upstream of the amplifier by using two other polynomials:

$$R' = a'_0 + a'_1 Ri + a'_2 Ri^2 + a'_3 Ri^3 \ldots + a'_n Ri^n$$

and $$\theta' = -\theta = b'_0 + b'_1 Ri + b'_2 Ri^2 + b'_3 Ri^3 \ldots + b'_n Ri^n.$$

Figure 6:
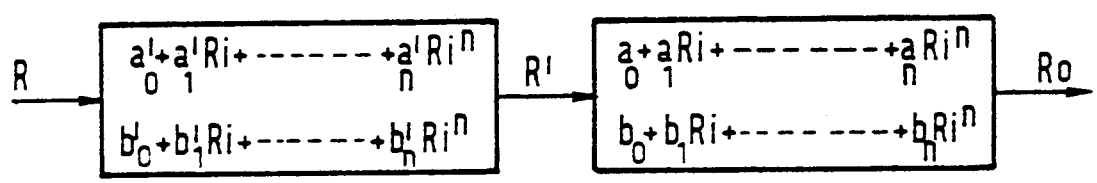
FIGS. 6 to 9 illustrate the method and the apparatus of the invention.

The principle of this correction is summarized in the block diagram of FIG. 6.

With digital processing, the coefficients $a'_i$ and $b'_i$ in the polynomial calculation can be adjusted at will, e.g. by means of a servo-control loop from the output of the transmitter.

An arbitrary vector is defined by its Cartesian coordinates $X_i$ and $Y_i$ along the two axes defined by the modulation.

Figure 7:
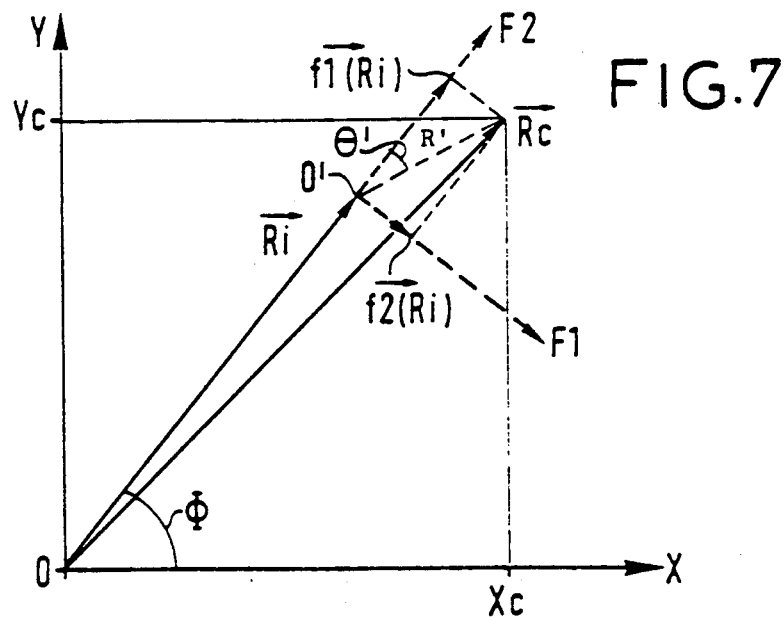

The vector diagram of FIG. 7 shows one example of the correction to be performed: if the modulus of the vector to be corrected is written $Ri$ and its phase relative to the axis $OX$ is written $\phi$, then two new axes related to the vector can be defined as follows: a first axis $O'F_1$ which is colinear with the vector; and a second axis $O'F_2$ which is in quadrature therewith.

Relative to these two new axes, two corrections are to be performed, namely:

$$f_1(Ri) = R' \cos \theta'$$

and $$f_2(Ri) = R' \sin \theta.$$

The fundamental idea of the invention is to remain in Cartesian coordinates (in order to avoid conversion into polar coordinates which would require two coordinate conversion tables), and to interpret the meaning of the corrections on these two axes.

The small values of the phase shifts encountered (they do not exceed 5° at the 1 dB compression point, i.e. at the point 1 dB beneath the amplitude/amplitude response assumed to be perfectly linear, makes it possible to use polynomial developments for $\cos \theta'$ and $\sin \theta'$.

$f_1(Ri)$ and $f_2(Ri)$ thus remain two polynomials having fixed (but modifiable) coefficients.

Figure 8:
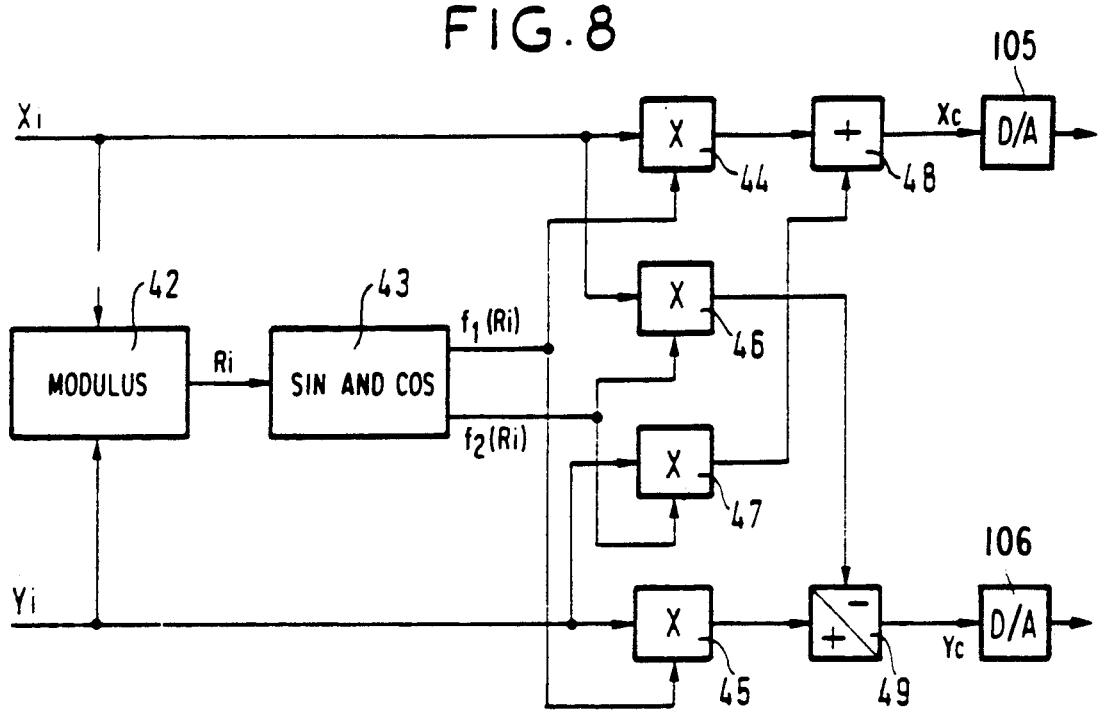

Transferred to the fixed axes $OX$ and $OY$, these corrections become:

$$\begin{aligned}
Xc &= Ri \cdot \cos[f_1(Ri)/Rc] + Ri \cdot \sin[f_2(Ri)/Rc] \\
&= X_i[f_1(Ri)/Rc] + Y_i[f_2(Ri)/Rc] \\
Yc &= Ri \cdot \sin[f_1(Ri)/Rc] + Ri \cdot \cos[f_2(Ri)/Rc] \\
&= Y_i[f_1(Ri)/Rc] - X_i[f_2(Ri)/Rc]
\end{aligned}$$

which gives the block diagram of FIG. 8.

The term $Rc$ corresponds to an amplitude and expresses the fact that $f_1(Ri)/Rc$ and $f_2(Ri)/Rc$ are dimensionless.

This block diagram comprises a circuit 42 for determining the modulus $Ri$ of the vector to be corrected, which circuit receives the signals $X$ and $Y$ prior to modulation and is followed by a circuit 43 for calculating $f_1(Ri)$ and $f_2(Ri)$, having two outputs corresponding to these two signals and each connected to one of the inputs of two multipliers 44 and 45 (46 and 47) whose second inputs receive the signals $X$ and $Y$ (44 and 46 receiving $X$, and 47 and 45 receiving $Y$). The outputs from the two multipliers 44 and 47 are connected to the inputs of a summing circuit 48 whose output is connected to the digital-to-analog converter 105 for the $X$ path. The outputs from the two multipliers 46 and 45 are applied to the − and + inputs respectively of a substractor 49 whose output is connected to the digital-to-analog converter 106 for the Y path.

Figure 9:
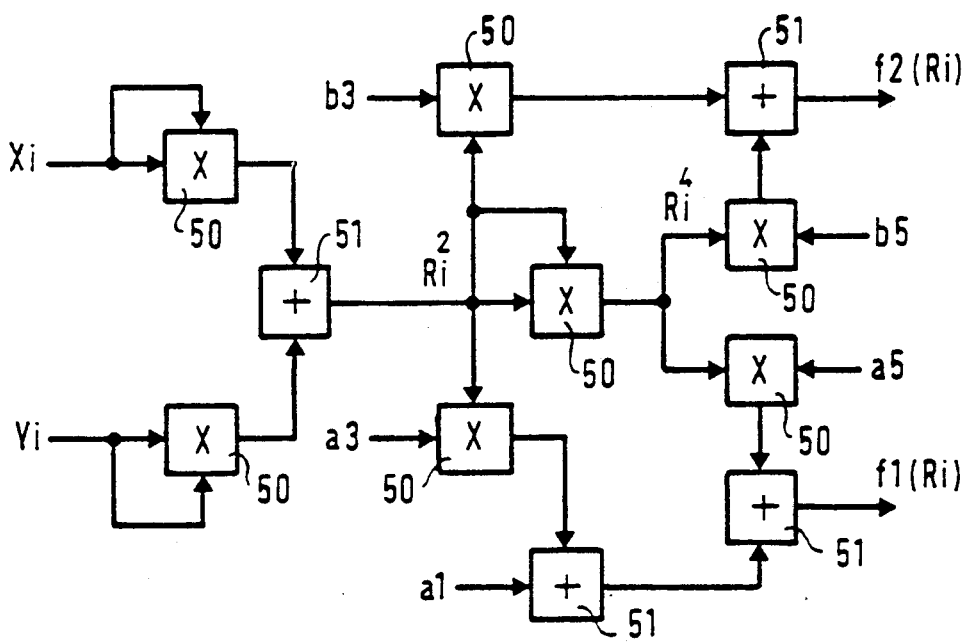

FIG. 9 shows one example of how $f_1$ and $f_2$ are determined, assuming zero calculation time, by using multipliers 50 and adders 51.

The inputs Xi and Yi of this circuit are the coordinates of the vector Ri represented by digital signals comprising a plurality of bits in parallel, e.g. 10 bits. The constants ai and bi are capable of being modified externally.

The circuit of the invention presents numerous advantages:

- processing Cartesian coordinates avoids the need to handle the angle $\phi$ of the vector to be corrected;
- since there is no coordinate system change, it is possible to integrate any further processing that may be required anywhere in the correction process;
- since the correction is not calculated on the signal paths, the system can be neutralized easily and completely by setting all of the coefficients of the correcting polynomials to zero, apart from the $a'_1$ term which is set to 1;
- the polynomial coefficients can be modified at will, and in particular they are therefore suitable for being servo-controlled to track phenomena of drift in characteristics; and
- the system can be inserted directly after a digital filter without degrading operation.

Naturally, the present invention is described and shown merely by way of preferred example and its component parts could be replaced by equivalents without thereby going beyond the scope of the invention.

We claim:

1. A digital method of correcting non-linearity in a transmission chain, in which the effects of amplifier non-linearities are compensated by means of baseband predistortion prior to modulation, the digital processing of the signal taking place in real time, wherein the digital processing is applied to Cartesian coordinates defining two new axes attached to an arbitrary vector to be corrected, the first new axis being collinear therewith, and the second being in quadrature therewith; wherein relative to these two new axes, two corrections $f_1(Ri)$ and $f_2(Ri)$ are to be performed, namely:

$$f_1(Ri) = R' \cos \theta'$$

and $$f_2(Ri) = R' \sin \theta'$$

with:

Ri = modulus of the vector to be corrected
$R' = a'_0 + a'_1 Ri + a'_2 Ri^2 + a'_3 Ri^3 \ldots + a'_n Ri^n$
$\theta' = b'_0 + b'_1 Ri + b'_2 Ri^2 + b'_3 Ri^3 \ldots + b'_n Ri^n$ with $a'_0 - a'_n$ and $b'_0 - b'_n$ being fixed coefficients and n being an integer; wherein, transferred to fixed axes OX and OY defined by the modulation, these corrections become:

$Xc = X_i[f_1(Ri)/Rc] + Y_i[f_2(Ri)/Rc]$ $Yc = Y_i[f_1(Ri)/Rc] - X_i[f_2(Ri)/Rc]$;

Rc corresponding to an amplitude: Xi and Yi being the Cartesian coordinates of the vector to be corrected along the axis OX and OY.

2. Apparatus for implementing the method according to claim 1, the apparatus comprising a modulus determining means for determining the modulus of the vector to be corrected, said modulus determining means receiving two signals, X and Y signals, prior to modulation, wherein said modulus determining means is followed by a correction calculating means for calculating two corrections ($f_1(Ri)$ and $f_2(Ri)$) to be applied along two axes determining relative to said vector, said correction calculating means having two outputs each connected to a first input of two corresponding multipliers with the second inputs of the multipliers respectively receiving said X and Y signals prior to modulation; the outputs from two of the multipliers being connected to the inputs of a summing circuit whose output is connected to a first digital-to-analog converter, and the output from the other two multipliers being connected to the input of a subtractor whose output is connected to a second digital-to-analog converter.

* * * * *